(12) United States Patent
Huh et al.

(10) Patent No.: US 10,041,173 B2
(45) Date of Patent: Aug. 7, 2018

(54) APPARATUS AND METHOD OF MANUFACTURING DISPLAY APPARATUS (71) Applicant: Samsung Display Co., Ltd., Yongin, Gyeonggi-Do (KR)

(72) Inventors: Myungsoo Huh, Yongin (KR); Dongkyun Ko, Yongin (KR); Choelmin Jang, Yongin (KR); Sungchul Kim, Yongin (KR); Inkyo Kim, Yongin (KR); Cheollae Roh, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 177 days.

(21) Appl. No.: 14/793,562

(22) Filed: Jul. 7, 2015

(65) Prior Publication Data
US 2016/0097124 A1 Apr. 7, 2016

(30) Foreign Application Priority Data

Oct. 6, 2014 (KR) ........................ 10-2014-0134487

(51) Int. Cl.
*C23C 16/50* (2006.01)
*C23C 16/54* (2006.01)
(Continued)

(52) U.S. Cl.
CPC ........ *C23C 16/50* (2013.01); *C23C 16/45563* (2013.01); *C23C 16/54* (2013.01);
(Continued)

(58) Field of Classification Search
None
See application file for complete search history.

(56) References Cited

U.S. PATENT DOCUMENTS

2003/0203210 A1 10/2003 Graff et al.
2006/0216951 A1 9/2006 Moro et al.
(Continued)

FOREIGN PATENT DOCUMENTS

KR 10-2010-0117633 A 11/2010
KR 10-2011-0054833 A 5/2011
(Continued)

OTHER PUBLICATIONS

Extended European Search Report dated May 27, 2016 for European Patent Application No. EP 15 188 507.6 which shares priority of Korean Patent Application No. KR 10-2014-0134487 with subject U.S. Appl. No. 14/793,562.
(Continued)

*Primary Examiner* — Shamim Ahmed
*Assistant Examiner* — Bradford M Gates
(74) *Attorney, Agent, or Firm* — Knobbe Martens Olson & Bear LLP (57) ABSTRACT

An apparatus and a method of manufacturing a display apparatus are disclosed. In one aspect, the apparatus includes a chamber and an inorganic layer forming nozzle unit formed in the chamber and configured to form at least one inorganic layer. The apparatus also includes an organic layer forming nozzle unit formed in the chamber and configured to form at least one organic layer, wherein the organic layer forming nozzle unit is arranged substantially in line with the inorganic layer forming nozzle unit. The apparatus further includes a separating nozzle unit formed between the inorganic layer forming nozzle unit and the organic layer forming nozzle unit and configured to spray an inert gas.

11 Claims, 5 Drawing Sheets

(51) Int. Cl.
    *H01J 37/32*      (2006.01)
    *C23C 16/455*     (2006.01)
    *H01L 51/52*      (2006.01)
(52) U.S. Cl.
    CPC .... *H01J 37/3244* (2013.01); *H01J 37/32449* (2013.01); *H01J 37/32752* (2013.01); *H01J 37/32899* (2013.01); *H01L 51/5256* (2013.01)

(56)         References Cited

U.S. PATENT DOCUMENTS

| 2007/0163440 | A1  | 7/2007  | Kim et al.                |
|--------------|-----|---------|---------------------------|
| 2009/0181303 | A1  | 7/2009  | Neudecker et al.          |
| 2009/0272322 | A1  | 11/2009 | Fujinami et al.           |
| 2010/0025675 | A1* | 2/2010  | Yamazaki ........ H01L 27/1225 257/43 |
| 2010/0041213 | A1  | 2/2010  | Lee                       |
| 2010/0068413 | A1  | 3/2010  | Lee                       |
| 2011/0052891 | A1  | 3/2011  | Takahashi et al.          |
| 2011/0114992 | A1* | 5/2011  | Schmid ............ C23C 16/0272 257/100 |
| 2012/0038066 | A1  | 2/2012  | Blum et al.               |
| 2012/0196050 | A1  | 8/2012  | Vermeer et al.            |
| 2012/0252149 | A1* | 10/2012 | Hiroki ............ H01L 27/3211 438/34 |
| 2012/0312232 | A1* | 12/2012 | Kim ............ C23C 16/45551 118/722 |
| 2013/0038390 | A1  | 2/2013  | Siomkos et al.            |
| 2014/0141154 | A1* | 5/2014  | Kim ................ C23C 14/24 427/58 |
| 2014/0178700 | A1  | 6/2014  | Iwase et al.              |

FOREIGN PATENT DOCUMENTS

| KR | 10-2012-0051059 A  |   | 5/2012 |
| KR | 20120043571 A      | * | 5/2012 |
| KR | 10-2012-0090380 A  |   | 8/2012 |

OTHER PUBLICATIONS

Polach, Stefan et al., "Matrix of Light Sensors Addressed by a-Si:H TFTs on a flexible Plastic Substrate," downloaded from http://reviews.spiedigitallibrary.org/ on Dec. 2, 2014, pp. 31-39.

Jang, Jin, Preparation and Properties of Hydrogenated Amorphous Silicon Film Transistors, *Thin-Film Transistors*, edited by Cherie R. Kagan and Paul Andry, Marcel Dekker, Inc. (2003), pp. 60-65.

Partial European Search Report dated Mar. 2, 2016 for European Patent Application No. EP 15 188 507.6 which shares priority of Korean Patent Application No. KR 10-2014-0134487 with subject U.S. Appl. No. 14/793,562.

European Examination Report dated Oct. 26, 2017 for European Patent Application No. EP 15 188 507.6, which shares priority of Korean Patent Application No. KR 10-2014-0134487 with subject U.S. Appl. No. 14/793,562.

* cited by examiner

APPARATUS AND METHOD OF MANUFACTURING DISPLAY APPARATUS

CROSS-REFERENCE TO RELATED APPLICATIONS

This application claims the benefit of Korean Patent Application No. 10-2014-0134487, filed on Oct. 6, 2014, in the Korean Intellectual Property Office, the disclosure of which is incorporated herein in its entirety by reference.

BACKGROUND

Field

The described technology generally relates to an apparatus and a method of manufacturing a display apparatus.

Description of the Related Technology

Portable or mobile devices are in wide use. For example, tablet computers are common examples of mobile electronic devices, in addition to small-sized electronic devices such as mobile phones.

These electronic devices include a display unit for supporting various functions and for providing a user with visual information such as images or videos. Recently, as components for driving the display unit have been miniaturized, the display unit has gradually increased in size. Moreover, displays capable of being curved, i.e., to have a predetermined angle(s) from a flat configuration have been developed.

SUMMARY OF CERTAIN INVENTIVE ASPECTS

One inventive aspect is an apparatus for manufacturing a display apparatus and a method of manufacturing the display apparatus.

Another aspect is an apparatus for manufacturing a display apparatus, the apparatus including: a chamber; an inorganic layer forming nozzle unit formed in the chamber, for forming inorganic layers; an organic layer forming nozzle unit formed in the chamber and arranged to be in line with the inorganic layer forming nozzle unit to form organic layers; and a separating nozzle unit formed between the inorganic layer forming nozzle unit and the organic layer forming nozzle unit to spray an inert gas.

The inorganic layer forming nozzle unit and the separating nozzle unit, and the organic layer forming nozzle unit and the separating nozzle unit may be formed to be separated from each other, and a gas in the chamber may be sucked between the inorganic layer forming nozzle unit and the separating nozzle unit and between the organic layer forming nozzle unit and the separating nozzle unit.

The apparatus may further include a conveying unit formed in the chamber to be linearly moved, wherein a substrate on which a display unit is formed is mounted on the conveying unit.

The inorganic layer forming nozzle unit may include: a source gas supply nozzle unit including a first space, to which a source gas is supplied to be sprayed; a plasma supply nozzle unit including a second space, to which a reaction gas is supplied to generate plasma, and spraying the plasma to outside; and a purge gas supply nozzle unit separated from at least one of the source gas supply nozzle unit and the plasma supply nozzle unit, and supplying a purge gas.

The plasma supply nozzle unit may include: a reaction gas supply unit formed in the second space and including a third space so that the reaction gas may be supplied through the third space; and a plasma supply nozzle body provided to surround the reaction gas supply unit to form the second space with the reaction gas supply unit, and generating a potential difference with the reaction gas supply unit to generate the plasma from the reaction gas supplied from the third space to the second space.

The organic layer forming nozzle unit may include a shower head supplying a deposition gas from outside to form activated ion species and spraying the activated ion species.

The organic layer forming nozzle unit may include: an outer portion forming an outer appearance; an insulating unit formed in the outer portion and including the shower head therein; and a second power source unit for generating a potential difference between the outer portion and the shower head.

The inorganic layer forming nozzle unit, the separating nozzle unit, and the organic layer forming nozzle unit may be sequentially arranged.

The organic layer forming nozzle unit, the separating nozzle unit, and the inorganic layer forming nozzle unit may be sequentially arranged.

A plurality of at least one of the inorganic layer forming nozzle and the organic layer forming nozzle unit may be provided.

The separating nozzle unit may be formed between two adjacent inorganic layer forming nozzle units or between two adjacent organic layer forming nozzle units.

The apparatus may further include an unloading unit for unloading the substrate from the chamber by connecting to the chamber, in which the substrate on which the display unit is formed is carried and a thin film encapsulation layer is formed on the display unit by forming at least one of the inorganic layer and the organic layer.

The apparatus may further include a protective layer forming unit connected to the unloading unit so that the substrate may be transferred from the unloading unit, and forming a protective layer on the thin film encapsulation layer.

Another aspect is a method of manufacturing a display apparatus, the method including: carrying a substrate, on which a display unit is formed, into a chamber; forming a thin film encapsulation layer by depositing an inorganic layer and an organic layer on the display unit in the chamber; and forming a protective layer on the thin film encapsulation layer by a protective layer forming unit connected to the chamber.

The thin film encapsulation layer may be formed by an inorganic layer forming nozzle unit for forming the inorganic layer and an organic layer forming nozzle unit for forming the organic layer, wherein the inorganic layer forming nozzle unit and the organic layer forming nozzle unit are arranged to be in line with each other in the chamber.

The substrate may be conveyed while the inorganic layer and the organic layer are formed.

The method may further include spraying an inert gas to a side surface of the substrate when forming the inorganic layer or the organic layer.

The method may further include sucking the inert gas. A plurality of at least one of the inorganic layer and the organic layer are provided.

Another aspect is an apparatus for manufacturing a display apparatus, the apparatus comprising: a chamber; an inorganic layer forming nozzle unit formed in the chamber and configured to form at least one inorganic layer; an organic layer forming nozzle unit formed in the chamber and configured to form at least one organic layer, wherein the organic layer forming nozzle unit is arranged substantially in line with the inorganic layer forming nozzle unit; and a separating nozzle unit formed between the inorganic layer forming nozzle unit and the organic layer forming nozzle unit and configured to spray an inert gas.

The above apparatus further comprises a gas suction unit configured to suck a gas in the chamber between the inorganic layer forming nozzle unit and the separating nozzle unit and between the organic layer forming nozzle unit and the separating nozzle unit. The above apparatus further comprises a conveyor formed in the chamber and configured to substantially linearly move, wherein the conveyor is further configured to receive a substrate on which a display unit is formed is mounted. In the above apparatus, the inorganic layer forming nozzle unit comprises: a source gas supply nozzle including a first space, to which a source gas is supplied to be sprayed; a plasma supply nozzle including a second space, to which a reaction gas is supplied to generate plasma, and configured to spray the plasma to the environment; and a purge gas supply nozzle separated from at least one of the source gas supply nozzle and the plasma supply nozzle, and configured to supply a purge gas. In the above apparatus, the plasma supply nozzle comprises: a reaction gas supply unit formed in the second space and including a third space through which the reaction gas is supplied; and a plasma supply nozzle body configured to surround the reaction gas supply unit to form the second space with the reaction gas supply unit, and configured to generate a potential difference with the reaction gas supply unit to generate the plasma from the reaction gas.

In the above apparatus, the organic layer forming nozzle unit comprises a shower head configured to supply a deposition gas to form activated ion species and configured to spray the activated ion species. In the above apparatus, the organic layer forming nozzle unit comprises: an outer portion forming an outer appearance; an insulating unit formed in the outer portion and including the shower head therein; and a second power source unit configured to generate a potential difference between the outer portion and the shower head. In the above apparatus, the inorganic layer forming nozzle unit, the separating nozzle unit, and the organic layer forming nozzle unit are sequentially arranged. In the above apparatus, the organic layer forming nozzle unit, the separating nozzle unit, and the inorganic layer forming nozzle unit are sequentially arranged. In the above apparatus, the inorganic layer forming nozzle is a plurality of nozzles and/or the organic layer forming nozzle unit is a plurality of nozzle units.

In the above apparatus, the separating nozzle unit is formed between two adjacent inorganic layer forming nozzle units or between two adjacent organic layer forming nozzle units. The above apparatus further comprises an unloader configured to unload a substrate, on which a display unit and a thin film encapsulation layer are formed, from the chamber. The above apparatus further comprises a protective layer forming unit connected to the unloader configured to transfer the substrate, wherein the protective layer forming unit is configured to form a protective layer on the thin film encapsulation layer.

Another aspect is a method of manufacturing a display apparatus, the method comprising: carrying a substrate, on which a display unit is formed, into a chamber; depositing inorganic and organic materials on the display unit in the chamber so as to form a thin film encapsulation layer; and forming a protective layer on the thin film encapsulation layer via a protective layer forming unit connected to the chamber.

In the above method, the thin film encapsulation layer is formed by an inorganic layer forming nozzle unit configured to spray the inorganic material and an organic layer forming nozzle unit configured to spray the organic material, and wherein the inorganic layer forming nozzle unit and the organic layer forming nozzle unit are arranged substantially in line with each other in the chamber. In the above method, the substrate is conveyed while the inorganic and organic materials are deposited. The above method further comprises spraying an inert gas to a side surface of the substrate when depositing the inorganic and organic materials. The above method further comprises sucking the inert gas. In the above method, the depositing comprises forming at least one inorganic layer and at least one organic layer.

Another aspect is an apparatus for manufacturing a display apparatus, the apparatus comprising: a chamber; a plurality of first nozzles placed in the chamber, wherein each of the first nozzles is configured to spray an inorganic material to form an inorganic layer; and a plurality of second nozzles placed in the chamber, wherein each of the second nozzles is configured to spray an organic material to form an organic layer, and wherein the first and second nozzles are alternately arranged.

DETAILED DESCRIPTION OF CERTAIN INVENTIVE EMBODIMENTS

As the described technology allows for various changes and numerous embodiments, particular embodiments will be illustrated in the drawings and described in detail in the written description. However, this is not intended to limit the described technology to particular modes of practice, and it is to be appreciated that all changes, equivalents, and substitutes that do not depart from the spirit and technical scope are encompassed in the described technology.

Hereinafter, the described technology will be described in detail by explaining exemplary embodiments of the described technology with reference to the attached drawings. Like reference numerals in the drawings denote like elements.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Referring to FIGS. 1 through 6, an apparatus 100 for manufacturing a display apparatus includes a chamber 120, an inorganic layer forming nozzle unit 130, an organic layer forming nozzle unit 140, a separating nozzle unit 150, a conveying unit or conveyor 160, a loading unit or loader 110, an unloading unit or unloader 170, and a protective layer forming unit 180.

Figure 1:
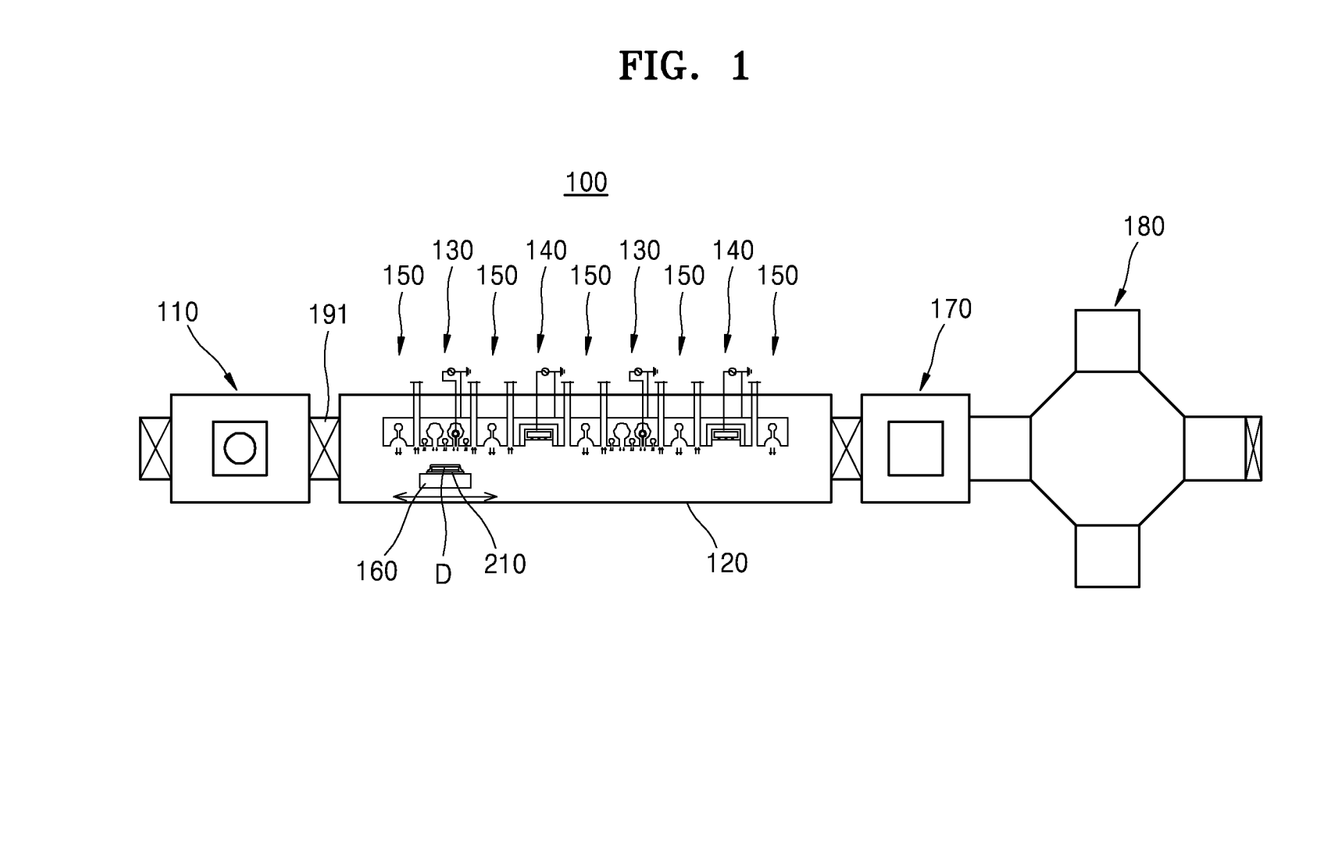
FIG. 1 is a conceptual view of an apparatus for manufacturing a display apparatus according to an embodiment.

The chamber 120 may be connected to the loading unit 110 and the unloading unit 170. Here, gate valves 191 may be provided between the chamber 120 and the loading unit 110, and between the chamber 120 and the unloading unit 170.

Figure 2:
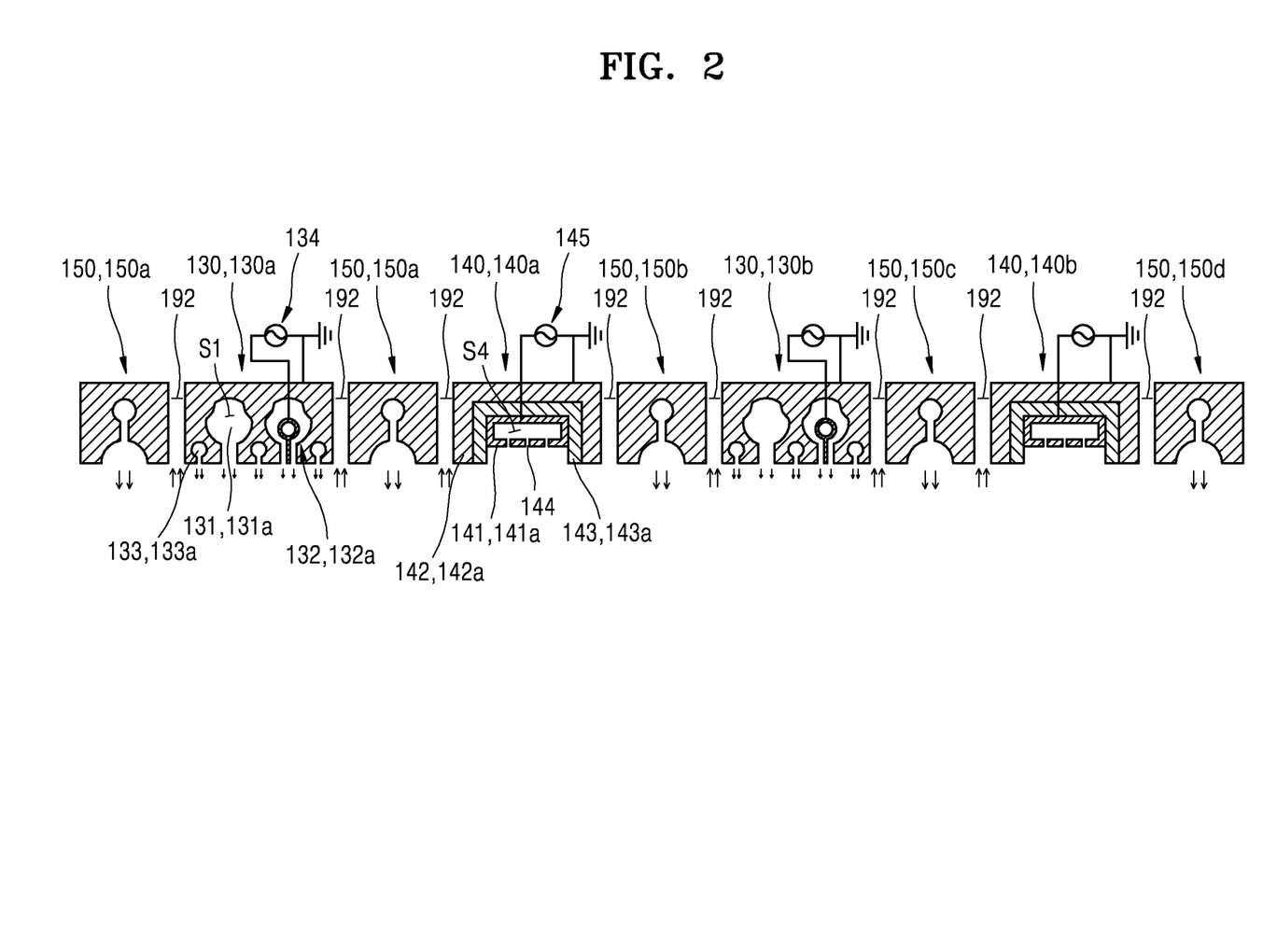
FIG. 2 is a conceptual view of an arrangement of an inorganic layer forming nozzle unit and an organic layer forming nozzle unit in the apparatus for manufacturing the display apparatus of FIG. 1.

The chamber 120 may have an internal space, in which the inorganic layer forming nozzle unit 130, the organic layer forming nozzle unit 140, the separating nozzle unit 150, and the conveying unit 160 may be formed. Herein, the inorganic layer forming nozzle unit 130, the organic layer forming nozzle unit 140, and the separating nozzle unit 150 may be arranged as in-line type.

The inorganic layer forming nozzle unit 130, the organic layer forming nozzle unit 140, and the separating nozzle unit 150 may be arranged in various ways. For example, the inorganic layer forming nozzle unit 130, the separating nozzle unit 150, and the organic layer forming nozzle unit 140 are sequentially formed. According to another embodiment, the organic layer forming nozzle unit 140, the separating nozzle unit 150, and inorganic layer forming nozzle unit 130 are sequentially formed. According to another embodiment, the inorganic layer forming nozzle unit 130, the separating nozzle unit 150, and the organic layer forming nozzle unit 140 form one group, and the group is repeatedly arranged. Otherwise, the organic layer forming nozzle unit 140, the separating nozzle unit 150, and the inorganic layer forming nozzle unit 130 may form one group, and the group is repeatedly arranged. Here, the separating nozzle unit 150 may be formed between the groups.

In addition to the above examples, at least one selected from the inorganic layer forming nozzle unit 130, the organic layer forming nozzle unit 140, and the separating nozzle unit 150 may be provided as plural. Here, in addition to the above examples, the separating nozzle unit 150 may be formed between the inorganic layer forming nozzle units 130 that are adjacent to each other from among the inorganic layer forming nozzle units 130. Also, the separating nozzle unit 150 may be formed between the organic layer forming nozzle units 140 that are adjacent to each other from among the organic layer forming nozzle units 140.

Hereinafter, if there are a plurality of inorganic layer forming nozzle units 130, a plurality of organic layer forming nozzle units 140, and a plurality of separating nozzle units 150 will be denoted by first, second, . . . , and N-th along a direction of conveying a substrate 210, for convenience of description.

For example, the inorganic layer forming nozzle units 130, the organic layer forming nozzle units 140, and the separating nozzle units 150 are arranged in an order of a first inorganic layer forming nozzle unit, a first separating nozzle unit, a second inorganic layer forming nozzle unit, a second separating nozzle unit, and a first organic layer forming nozzle unit. Also, the first organic layer forming nozzle unit, the first separating nozzle unit, the second organic layer forming nozzle unit, the second separating nozzle unit, and the first inorganic layer forming nozzle unit may be sequentially arranged. In addition, the first organic layer forming nozzle unit, the first separating nozzle unit, the second organic layer forming nozzle unit, the second separating nozzle unit, the first inorganic layer forming nozzle unit, the third separating nozzle unit, the third organic layer forming nozzle unit, the fourth separating nozzle unit, and the fourth organic layer forming nozzle unit may be sequentially arranged.

As another embodiment, the first organic layer forming nozzle unit, the first separating nozzle unit, the second organic layer forming nozzle unit, the second separating nozzle unit, the first inorganic layer forming nozzle unit, the third separating nozzle unit, the third organic layer forming nozzle unit, the fourth separating nozzle unit, the fourth organic layer forming nozzle unit, the fifth separating nozzle unit, the second inorganic layer forming nozzle unit, the sixth separating nozzle unit, the fifth organic layer forming nozzle unit, the seventh separating nozzle unit, and the sixth organic layer forming nozzle unit are sequentially arranged.

As another embodiment, the first organic layer forming nozzle unit, the first separating nozzle unit, the first inorganic layer forming nozzle unit, the second separating nozzle unit, the second organic layer forming nozzle unit, the third separating nozzle unit, the second inorganic layer forming nozzle unit, the third separating nozzle unit, the second inorganic layer forming nozzle unit, the fourth separating nozzle unit, and the third organic layer forming nozzle unit are sequentially arranged.

The arrangement of the inorganic layer forming nozzle units 130, the organic layer forming nozzle units 140, and the separating nozzle units 150 is not limited to the above examples, but the arrangement may include all kinds of arrangements for stacking organic and inorganic layers without regard to an order.

However, the inorganic layer forming nozzle units 130, the organic layer forming nozzle units 140, and the separating nozzle units 150 are assumed to be arranged in an order of the inorganic layer forming nozzle unit 130a, a first separating nozzle unit 150a, a first organic layer forming nozzle unit 140a, a second separating nozzle unit 150b, a second inorganic layer forming nozzle unit 130b, a third separating nozzle unit 150c, a second organic layer forming nozzle unit 140b, and a fourth separating nozzle unit 150d.

In addition, the inorganic layer forming nozzle unit 130 may form an inorganic layer. Also, the organic layer forming nozzle unit 140 may form an organic layer. Here, the inorganic layer forming nozzle unit 130 may form the inorganic layer in an atomic layer deposition (ALD) method, and the organic layer forming nozzle unit 140 may form the organic layer in a chemical vapor deposition method.

Figure 3:
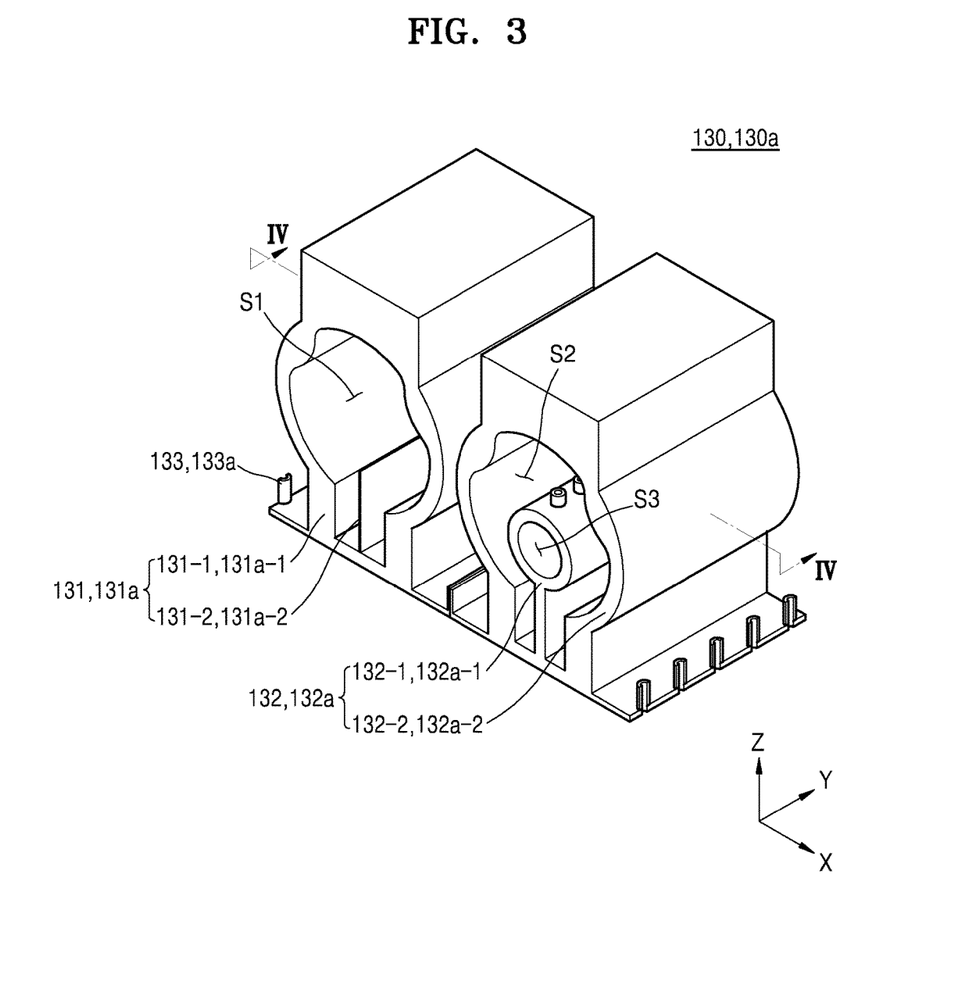
FIG. 3 is an exploded perspective view of the inorganic layer forming nozzle unit of FIG. 2.
Figure 4:
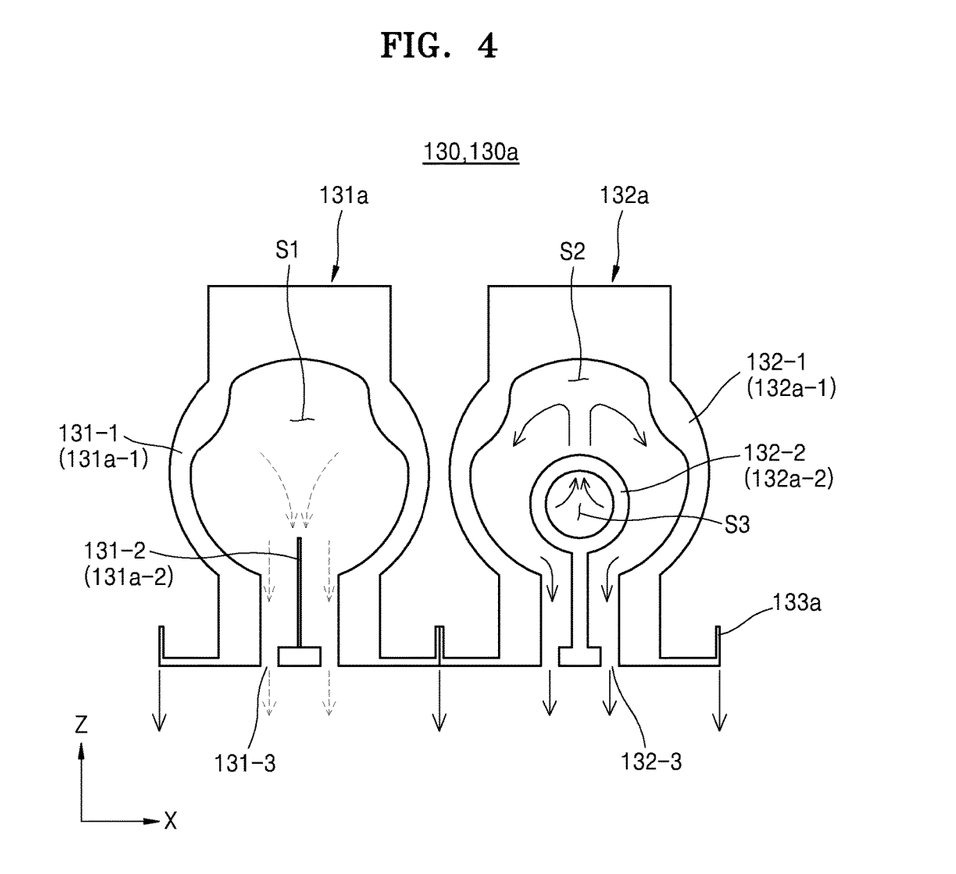
FIG. 4 is a cross-sectional view of the inorganic layer forming nozzle unit taken along line IV-IV of FIG. 3.

The inorganic layer forming nozzle unit 130 may include a source gas supply nozzle unit 131, a plasma supply nozzle unit 132, and a purge gas supply nozzle unit 133. Here, the source gas supply nozzle unit 131 and the plasma supply nozzle unit 132 may be elongated in a length direction or a width direction of the substrate 210.

The source gas supply nozzle unit 131 has a first space S1 therein so that a source gas is supplied into the first space S1 and sprayed. For example, the source gas supply nozzle unit 131 includes a source gas supply body 131-1 in which the first space S1 is formed, and a source gas supply nozzle 131-2 connected to the source gas supply body 131-1 and protruding from the first space S1. Here, the source gas supply nozzle unit 131 may include a first hole 131-3 on a lower portion thereof, wherein the source gas is discharged into the chamber through the first hole 131-3.

The plasma supply nozzle unit 132 includes a second space S2, in which a reaction gas is supplied to generate plasma and spray plasma to outside. Here, the plasma supply nozzle unit 132 may include a reaction gas supply unit 132-1 that is formed in the second space S2 and has a third space S3, in which the reaction gas is supplied. Also, the plasma supply nozzle unit 132 may include a plasma supply nozzle body 132-2 that is provided to surround the reaction gas supply unit 132-1 to form the second space S2 with the reaction gas supply unit 132-1. Here, the plasma supply nozzle body 132-2 may generate plasma in the second space S2 by generating a potential difference from the reaction gas supply unit 132-1. For example, the plasma supply nozzle body 132-2 includes a second hole 132-3 through which the plasma may be discharged to outside.

The plasma supply nozzle unit 132 may include a first power source unit 134 generating the potential difference between the reaction gas supply unit 132-1 and the plasma supply nozzle body 132-2. The first power source unit 134 may be a direct current (DC) power source or an alternating current (AC) power source.

The purge gas supply nozzle unit 133 may be formed to separate from at least one of the source gas supply nozzle unit 131 and the plasma supply nozzle unit 133. Here, the purge gas supply nozzle unit 133 may supply a purge gas into the chamber.

The organic layer forming nozzle unit 140 may form an organic layer. Here, the organic layer forming nozzle unit 140 may form the organic layer by using a chemical vapor deposition method. The organic layer forming nozzle unit 140 may use various energy sources in order to form the organic layer by using the chemical vapor deposition method. Hereinafter, for convenience of description, a case where the organic layer forming nozzle unit 140 use plasma as the energy source will be described below.

A shower head 141 may be provided. Here, the shower head 141 includes a fourth space S4 therein, and a third hole 144 is formed on a lower portion of the shower head 141 so that a gas in the fourth space S4 may be discharged to outside.

The organic layer forming nozzle unit 140 may include an outer portion 142 forming an outer appearance, and an insulating unit 143 formed in the outer portion 142 and provided to surround the shower head 141. The organic layer forming nozzle unit 140 may include a second power source unit 145 generating a potential difference between the outer portion 142 and the shower head 141.

Meanwhile, the separating nozzle unit 150 may spray an inert gas. Here, the inert gas may include argon (Ar), helium (He), and nitrogen ($N_2$). The separating nozzle unit 150 may spray the inert gas to block the inorganic layer forming nozzle unit 130 and the organic layer forming nozzle unit 140 from each other, as described above. For example, the separating nozzle unit 150 sprays the inert gas so as to surround at least one of the inorganic layer forming nozzle unit 130 and the organic layer forming nozzle unit 140.

There may be a plurality of separating nozzle units 150. Here, each of the separating nozzle units 150 may be formed between the inorganic layer forming nozzle unit 130 and the organic layer forming nozzle unit 140 or between the organic layer forming nozzle unit 140 and the inorganic layer forming nozzle unit 130.

Between the nozzle units, a gas suction unit 192 may be formed in order to suck the gas to outside. For example, the separating nozzle unit 150 and the inorganic layer forming nozzle unit 130 may be separated from each other, and the gas suction unit 192 may be formed between the separating nozzle unit 150 and the inorganic layer forming nozzle unit 130. Also, the separating nozzle unit 150 and the organic layer forming nozzle unit 140 may be separated from each other, and the gas suction unit 192 may be formed between the separating nozzle unit 150 and the organic layer forming nozzle unit 140.

The gas suction unit 192 is formed adjacent to each of the nozzle units so as to suck gases generated during the processes in each of the nozzle units.

The conveying unit 160 may be provided in the chamber 120 so as to substantially linearly move. Here, the substrate 210 may be mounted on the conveying unit 160 and may be linearly moved. For example, the conveying unit 160 conveys the substrate 210 in a direction in which each of the nozzle units is formed. Also, the conveying unit 160 may move in a substantially linear direction while penetrating through the loading unit 110, the chamber 120, the unloading unit 170, and the protective layer forming unit 180.

The conveying unit 160 may be formed in various types. For example, the conveying unit 160 may be formed as a shuttle, or a conveyer. For example, if the conveying unit 160 is formed as a shuttle, a linear motor may be provided to convey the shuttle.

In addition, the loading unit 110 may load the substrate 210 provided from outside into the chamber 120. Here, the loading unit 110 is the same as or similar to a loading chamber that is generally used in a display device, and thus, detailed descriptions thereof are omitted.

The unloading unit 170 may convey the substrate 210 supplied from the chamber 120 to the protective layer forming unit 180. Here, the unloading unit 170 may include a robot arm to convey the substrate 210.

The protective layer forming unit 180 may form a protective layer P. Here, the protective layer forming unit 180 may form the protective layer P by using a chemical vapor deposition method. The protective layer P may include metal-based oxides or nitrides such as silicon nitride (SiNx), silicon oxynitride (SiOxNy), titanium oxide (TIOx), titanium nitride (TINx), titanium oxynitride (TiOxNy), zirconium oxide (ZrOx), tantalum nitride (TaNx), tantalum oxide (TaNx), hafnium oxide (HfOx), and aluminum oxide (AlOx).

Figure 5:
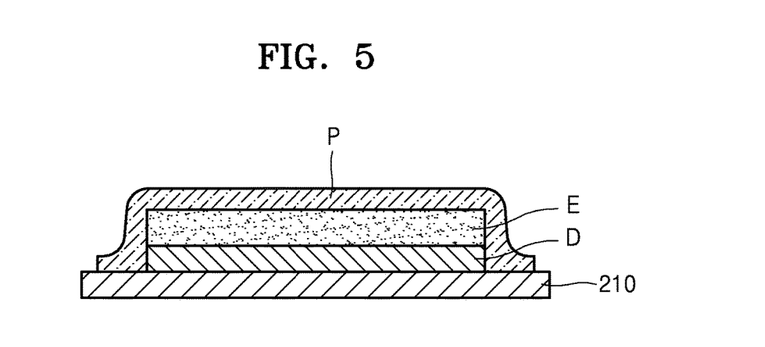
FIG. 5 is a conceptual view of a display apparatus manufactured by the apparatus for manufacturing the display apparatus of FIG. 1.

According to a method of manufacturing a display apparatus 200 by using the apparatus 100 for manufacturing display apparatus, layers are stacked on the substrate 210, and then, an organic light emitting device 280 is formed on the substrate 210 and the substrate 210 is supplied to the loading unit 110.

Figure 6:
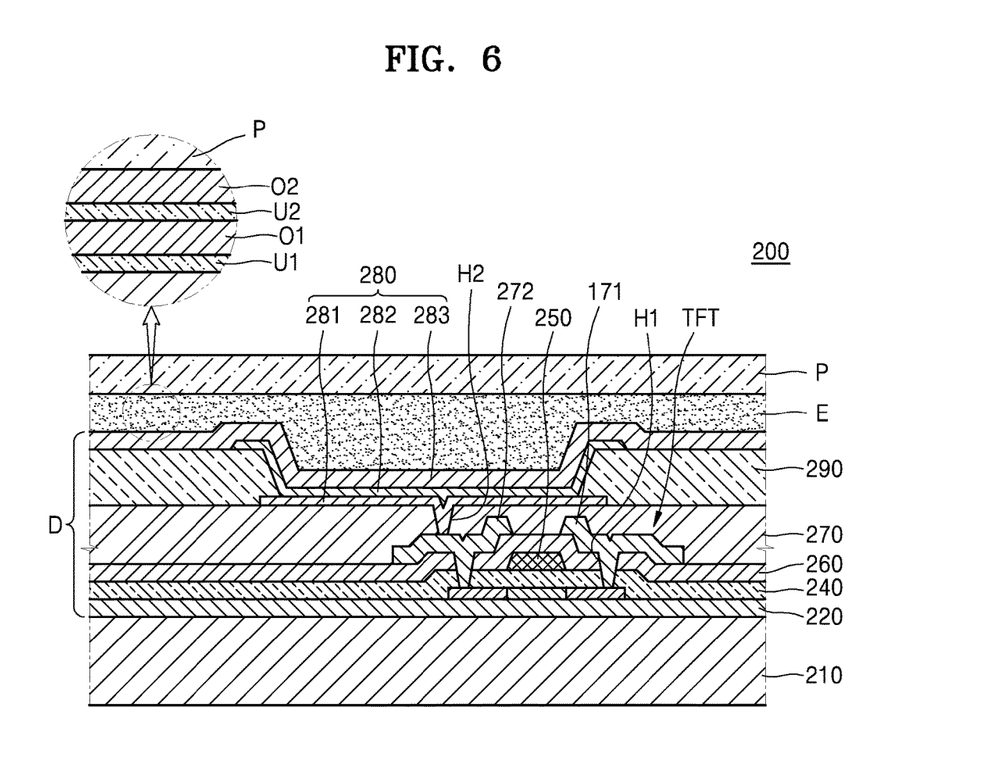
FIG. 6 is a cross-sectional view of a part of the display apparatus of FIG. 5.

Here, a display unit D may be formed on the substrate 210 supplied to the loading unit 110. The display unit D includes thin film transistors (TFT), a passivation layer 270 covering the TFTs, and the organic light emitting device 280 may be formed on the passivation layer 270.

The substrate 210 may be formed of a glass material, but is not limited thereto. That is, the substrate 210 may be formed of a plastic material or a metal material such as SUS and Ti. In addition, the substrate 210 may include polyimide (PI). Hereinafter, a case where the substrate 210 is formed of the glass material will be described for convenience of description.

A buffer layer 220 formed of an organic compound and/or an inorganic compound, for example, SiOx (x≥1) and SiNx (x≥1), is further formed on an upper surface of the substrate 210.

An active layer 230 that is arranged in predetermined patterns is formed on the buffer layer 220, and is buried by a gate insulating layer 240. The active layer 230 includes a source region 231 and a drain region 233, and a channel region 232 between the source and drain regions 231 and 233.

The active layer 230 may be formed of various materials. For example, the active layer 230 may include an inorganic semiconductor material such as amorphous silicon or crystalline silicon. As another example, the active layer 230 may contain oxide semiconductor. As another example, the active layer 230 may include an organic semiconductor material. Hereinafter, a case in which the active layer 230 is formed of amorphous silicon will be described below for convenience of description.

The active layer 230 may be formed as a polycrystalline silicon layer, by forming an amorphous silicon layer on the buffer layer 220 and crystallizing the amorphous silicon layer, and then, the polycrystalline silicon layer is patterned. The active layer 230 has the source region 231 and the drain region 233 that are doped with impurities according to a kind of TFT, for example, a driving TFT (not shown) or a switching TFT (not shown).

A gate electrode 250 corresponding to the active layer 230 and an interlayer insulating layer 260 burying the gate electrode 250 are formed on the gate insulating layer 240.

In addition, a contact hole H1 is formed in the interlayer insulating layer 260 and the gate insulating layer 240, and a source electrode 271 and a drain electrode 272 are formed on the interlayer insulating layer 260 to respectively contact the source region 231 and the drain region 233.

The passivation layer 270 is formed on the TFT, and a pixel electrode 281 of the organic light emitting device (OLED) is formed on the passivation layer 270. The pixel electrode 281 contacts the drain electrode 272 of the TFT via the via hole H2 formed in the passivation layer 270. The passivation layer 270 may be formed of an inorganic material and/or an organic material in a single-layered or multi-layered structure. In addition, the passivation layer 270 may be formed as a planarization layer having a flat upper surface without regard to irregular lower layer, or may be formed along with the surface of the lower layer. In addition, the passivation layer 270 may be formed of a transparent insulating material for achieving a resonant effect.

After forming the pixel electrode 281 on the passivation layer 270, a pixel defining layer 290 is formed of an organic material and/or an inorganic material to cover the pixel electrode 281 and the passivation layer 270 and an opening is formed to expose the pixel electrode 281.

In addition, an intermediate layer 282 and an opposite electrode 283 are formed at least on the pixel electrode 281.

The pixel electrode 281 functions as an anode electrode and the opposite electrode 283 functions as a cathode, or vice versa.

The pixel electrode 281 and the opposite electrode 293 are insulated from each other by the intermediate layer 282, and apply voltages of different polarities to the intermediate layer 282 to make an organic emission layer emit light.

The intermediate layer 282 may include the organic emission layer. As another example, the intermediate layer 282 includes the organic emission layer, and may further include at least one selected from a hole injection layer (HIL), a hole transport layer (HTL), an electron transport layer (ETL), and an electron injection layer (EIL).

In addition, one unit pixel P includes a plurality of sub-pixels R, G, and B, and the plurality of sub-pixels R, G, and B may emit light of various colors. For example, the plurality of sub-pixels R, G, and B may include sub-pixels R, G, and B emitting red, green, and blue light and sub-pixels (not shown) emitting red, green, blue, and white light.

As described above, when the substrate 210 on which the display unit D is formed enters the chamber 120 through the loading unit 110, a thin film encapsulation layer E may be formed on the display unit D. The thin film encapsulation layer E may include a plurality of inorganic layers, or an inorganic layer and an organic layer.

The organic layer of the thin film encapsulation layer E may be formed of polymer, for example, the organic layer may have a single-layered structure or a stacked structure including one of polyethylene terephthalate, polyimide, polycarbonate, epoxy, polyethylene, and polyacrylate. In particular, the organic layer may be formed of polyacrylate, and may include a polymerized monomer composition including diacrylate-based monomer and triacrylate-based monomer. The monomer composition may further include monoacrylate-based monomer. Also, the monomer composition may further include a well-known photoinitiator such as 2,4,6-trimethyl benzoyl diphenyl phosphine oxide (TPO); however, one or more embodiments of the present invention are not limited thereto.

The inorganic layer in the thin film encapsulation layer E may have a single-layered structure or a stacked structure including metal oxide or metal nitride. In particular, the inorganic layer may include one of SiNx, $Al_2O_3$, $SiO_2$, and $TiO_2$.

An uppermost layer of the thin film encapsulation layer E may be formed of an inorganic layer in order to prevent moist infiltration into the organic light emitting device.

The thin film encapsulation layer E may include at least one sandwich structure, in which at least one organic layer is inserted between at least two inorganic layers. As another example, the thin film encapsulation layer E includes at least one sandwich structure, in which at least one inorganic layer is inserted between at least two organic layers. As another example, the thin film encapsulation layer E includes a sandwich structure, in which at least one organic layer is inserted between at least two inorganic layers and a sandwich structure, in which at least one inorganic layer is inserted between at least two organic layers.

The thin film encapsulation layer E may include a first inorganic layer, a first organic layer, and a second inorganic layer sequentially from an upper portion of the organic light emitting device (OLED).

As another example, the thin film encapsulation layer E includes a first inorganic layer, a first organic layer, a second inorganic layer, a second organic layer, and a third inorganic layer sequentially from the upper portion of the organic light emitting device (OLED).

As another example, the thin film encapsulation layer E includes a first inorganic layer, a first organic layer, a second inorganic layer, a second organic layer, a third inorganic layer, a third organic layer, and a fourth inorganic layer from the upper portion of the organic light emitting device (OLED).

As another example, the thin film encapsulation layer E includes a first inorganic layer, a first organic layer, a second inorganic layer, and a second organic layer.

As another example, the thin film encapsulation layer E includes a first organic layer, a first inorganic layer, a second organic layer, a second inorganic layer, and a third organic layer.

As another example, the thin film encapsulation layer E includes a first organic layer, a second organic layer, a first inorganic layer, a third organic layer, a fourth organic layer, a second inorganic layer, a fifth organic layer, and a sixth organic layer.

A metal halide layer including LiF may be further included between the OLED and the first inorganic layer. The metal halide layer may prevent damage to the OLED when the first inorganic layer is formed by a sputtering method.

The first organic layer may have an area that is less than that of the second inorganic layer, and the second organic layer may have an area that is less than that of the third inorganic layer.

The thin film encapsulation layer E is not limited to the above example, but may include all kinds of structures, in which inorganic layers and organic layers are stacked in various ways. Hereinafter, a case where the thin film encapsulation layer E includes a first inorganic layer U1, a first organic layer O1, a second inorganic layer U2, and a second organic layer O2 will be described below, for convenience of description.

According to the method of forming the thin film encapsulation layer E, a pressure in the chamber 120 and a pressure in the protective layer forming unit 180 may be maintained to be equal to or lower than a predetermined pressure before the substrate 210 enters the chamber 120.

Here, when the substrate 210 is mounted on the conveying unit 160 and is carried into the chamber 120 from the loading unit 110, the first inorganic layer forming nozzle unit 130a may form the first inorganic layer U1 on the display unit D. A source gas may be supplied from the first source gas supply nozzle unit 131a onto the display unit D. For example, when the source gas is supplied to the first space S1 of the source gas supply body 131a-1, the source gas may be discharged into the chamber 120 via the first source gas supply nozzle 131a-2. The source gas may be mounted and absorbed on the display unit D. After that, the purge gas is supplied from the first purge gas supply nozzle unit 133a to remove the same kind of material absorbed on the surface of the display unit D.

Also, a reaction gas is supplied through the first plasma supply nozzle unit 132a to generate plasma, and then, the plasma is sprayed onto the display unit D to be absorbed on the display unit D. Here, the reaction gas may be introduced in the length direction of the first reaction gas supply unit 132a-1 through the third space S3 of the first reaction gas supply unit 132a-1. The reaction gas may be discharged from the third space S3 of the first reaction gas supply unit 132a-1 to the second space S2, and the first power source unit 134 generates the potential difference between the first reaction gas supply unit 132a-1 and the first plasma supply nozzle body 132a-2 to generate the plasma from the reaction gas. The plasma is sprayed into the chamber 120 through the second hole 132-3 of the first plasma supply nozzle body 132a-2 and absorbed on the display unit D.

After finishing the above processes, the purge gas is supplied from the first purge gas supply nozzle unit 133a to remove by-products of the reaction on the display unit D.

During the above processes, the first separating nozzle unit 150a sprays the inert gas to block the other region of the chamber 120 from the first inorganic layer forming nozzle unit 130a. The first separating nozzle unit 150a may be provided to surround the first inorganic layer forming nozzle unit 130a.

When the inert gas is sprayed from the first separating nozzle unit 150a, the inert gas blocks the first inorganic layer forming nozzle unit 130a from outside to prevent the by-products or the gas from the first inorganic layer forming nozzle unit 130a from leaking.

Also, during spraying the inert gas as above, the inert gas, the by-product, and the used gas may be sucked between the first inorganic layer forming nozzle unit 130a and the first separating nozzle unit 150a to be discharged out of the chamber 120.

When the first inorganic layer U1 is formed on the display unit D after performing the above processes, the conveying unit 160 may be convey the substrate 210 to a lower surface of the first organic layer forming nozzle unit 140a.

The first organic layer forming nozzle unit 140a may operate in a similar way to the first inorganic layer forming nozzle unit 130a. In particular, a deposition gas is supplied to the first shower head 141a to form activated ion species and the activated ion species are sprayed onto the substrate 210. The second power source unit 145 generates a potential difference between the first outer portion 142a and the first shower head 141a to deposit the deposition gas on the display unit D. Here, the first insulating unit 143a may insulate the first outer portion 142a and the first shower head 141a from each other.

After finishing the above processes, the first organic layer O1 may be formed on the first inorganic layer U1. Here, the second separating nozzle unit 150b may block the first organic layer forming nozzle unit 140a from outside, similarly to the first separating nozzle unit 150a.

The above processes may be performed to form the second inorganic layer U2 and the second organic layer O2. Here, the first inorganic layer U1, the first organic layer O1, the second inorganic layer U2, and the second organic layer O2 are sequentially stacked, and each of the above layers may not be clearly distinguished from the other layers. In particular, since the first inorganic layer U1, the first organic layer O1, the second inorganic layer U2, and the second organic layer O2 are formed in the chamber 120, the inorganic layers and the organic layers may be mixed at boundaries between the layers.

After forming the thin film encapsulation layer E by sequentially forming the first inorganic layer U1, the first organic layer O1, the second inorganic layer U2, and the second organic layer O2 on the display unit D, the conveying unit 160 may supply the substrate 210 to the unloading unit 170.

The substrate 210 is supplied from the unloading unit 170 to the protective layer forming unit 180, and the protective layer forming unit 180 may form a protective layer P on the thin film encapsulation layer E. The protective layer P may be formed in various ways. For example, the protective layer P may be formed by using a sputtering method, an ion beam deposition method, an evaporation method, or a chemical vapor deposition method. Hereinafter, it will be assumed that the protective layer P is formed by using the chemical vapor deposition method for convenience of description.

The protective layer P may be formed to substantially surround the complete side surfaces of the thin film encapsulation layer E. Therefore, the protective layer P may protect the thin film encapsulation layer E against moisture or oxygen and thus may increase lifespan of the thin film encapsulation layer E.

According to the apparatus 100 and method of manufacturing the display apparatus, the substrate 210 is conveyed in-line in one chamber 210 to form the thin film encapsulation layer E, and thus, footprint that may occur when the thin film encapsulation layer E is formed may be reduced.

Also, according to the apparatus 100 and method of manufacturing the display apparatus, the thin film encapsulation layer E is formed by forming the inorganic layers and the organic layers within one chamber 120, and thus, cracks in each layer, which may occur if the inorganic layers and the organic layers are formed in separate chambers from each other, may be prevented.

In addition, the inorganic layers and the organic layers are sequentially and successively stacked, and then, the protective layer P is formed. Thus, the moisture infiltration to the display apparatus 200 from outside may be prevented.

As described above, according to at least one of the disclosed embodiments, the lifespan of the display apparatus may be increased.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
    carrying a substrate, on which a display unit is formed, into a chamber, wherein the display unit includes a pixel electrode, an intermediate layer formed over the pixel electrode and an opposite electrode formed over the intermediate layer;
    depositing inorganic and organic materials on the opposite electrode of the display unit in the chamber so as to form a thin film encapsulation layer over the opposite electrode; and
    forming a protective layer on the thin film encapsulation layer via a protective layer forming unit located outside and connected to the chamber.

2. The method of claim 1, wherein the thin film encapsulation layer is formed by an inorganic layer forming nozzle unit configured to spray the inorganic material and an organic layer forming nozzle unit configured to spray the organic material, and wherein the inorganic layer forming nozzle unit and the organic layer forming nozzle unit are arranged substantially in line with each other in the chamber.

3. The method of claim 1, wherein the substrate is conveyed while the inorganic and organic materials are deposited.

4. The method of claim 1, further comprising spraying an inert gas to a side surface of the substrate when depositing the inorganic and organic materials.

5. The method of claim 4, further comprising sticking the inert gas.

6. The method of claim 1, wherein the depositing comprises forming at least one inorganic layer and at least one organic layer.

7. The method of claim 1, wherein the forming comprises:
    moving the substrate from the inside of the chamber to the outside of the chamber with the use of an unloading unit; and
    forming the protective layer over the thin film encapsulation layer at the outside of the chamber with the use of the protective layer forming unit.

8. The method of claim 1, wherein the protective layer surrounds side surfaces of the thin film encapsulation layer.

9. A method of manufacturing a display apparatus, the method comprising:
    carrying a substrate, on which a display unit is formed, into a chamber, wherein the display unit includes a pixel electrode, an intermediate layer formed over the pixel electrode and an opposite electrode formed over the intermediate layer;
    depositing inorganic and organic materials on the opposite electrode of the display unit in the chamber so as to form a thin film encapsulation layer over the opposite electrode;
    spraying an inert gas between an area of a deposited inorganic material and an area of a deposited organic material so as to separate the area of the deposited inorganic material from the area of the deposited organic material; and
    forming a protective layer on the thin film encapsulation layer via a protective layer forming unit connected to the chamber.

10. The method of claim 9, wherein a spraying direction of the inert gas is the same as a spraying direction of one of the inorganic material or the organic material.

11. The method of claim 9, wherein the inert gas sprays toward the display unit.

* * * * *